United States Patent
Jway et al.

(10) Patent No.: US 11,880,607 B2
(45) Date of Patent: Jan. 23, 2024

(54) MEMORY WITH FUSE PINS SHARED BY MULTIPLE-TYPE REPAIRS

(71) Applicant: MediaTek Singapore Pte. Ltd., Singapore (SG)

(72) Inventors: Kim Soon Jway, Singapore (SG); Shu-Lin Lai, Hsinchu (TW); Yi-Ping Kuo, Hsinchu (TW)

(73) Assignee: MEDIATEK SINGAPORE PTE. LTD., Singapore (SG)

( * ) Notice: Subject to any disclaimer, the term of this patent is extended or adjusted under 35 U.S.C. 154(b) by 73 days.

(21) Appl. No.: 17/528,248

(22) Filed: Nov. 17, 2021

(65) Prior Publication Data

US 2022/0171543 A1     Jun. 2, 2022

Related U.S. Application Data

(60) Provisional application No. 63/120,272, filed on Dec. 2, 2020.

(51) Int. Cl.
*G06F 3/06*     (2006.01)
*G11C 29/00*     (2006.01)

(52) U.S. Cl.
CPC .......... *G06F 3/0673* (2013.01); *G11C 29/00* (2013.01)

(58) Field of Classification Search
CPC ........... G06F 3/0673; G11C 29/00; G11C 2029/1804; G11C 2029/1806; G11C 2029/3602; G11C 29/18; G11C 29/36; G11C 29/4401; G11C 29/785; G11C 29/848; G11C 29/802; G11C 29/027; G11C 29/44

See application file for complete search history.

(56) References Cited

U.S. PATENT DOCUMENTS

| | | | |
|---|---|---|---|
| 6,535,993 B1 * | 3/2003 | Hamada | G11C 29/56 714/42 |
| 7,734,966 B1 * | 6/2010 | Lee | G11C 29/00 714/719 |
| 9,508,456 B1 | 11/2016 | Shim | |
| 10,755,799 B1 | 8/2020 | Montierth | |
| 2002/0006064 A1 | 1/2002 | Hidaka | |
| 2006/0039210 A1 * | 2/2006 | Blodgett | G11C 17/16 365/200 |
| 2006/0179368 A1 * | 8/2006 | Chang | G11C 29/44 714/718 |
| 2010/0318843 A1 | 12/2010 | Singh | |
| 2013/0010538 A1 | 1/2013 | Blodgett | |

OTHER PUBLICATIONS

Extended European Search Report, Application No. 21210776.7-1211, dated Apr. 22, 2022.

* cited by examiner

*Primary Examiner* — Mohammed A Bashar
(74) *Attorney, Agent, or Firm* — Tong J. Lee (57) ABSTRACT

A self-repair memory circuit includes a cell array, a controller, a row repair decoder, and a column repair decoder. The cell array includes rows and columns of memory cells. The controller receives an input indicating row repair or column repair, and a repair address shared by the row repair and the column repair of the cell array. The row repair decoder maps the repair address of a defective row to a redundant row of the cell array when the input indicates the row repair. The column repair decoder maps the repair address of a defective column to another column of the cell array when the input indicates the column repair.

19 Claims, 6 Drawing Sheets

| RR_EN | CR_EN | R/C Repair Address |
|---|---|---|
| 0 | 0 | disabled |
| 0 | 1 | column address |
| 1 | 0 | row address |
| 1 | 1 | disabled |

MEMORY WITH FUSE PINS SHARED BY MULTIPLE-TYPE REPAIRS

CROSS-REFERENCE TO RELATED APPLICATIONS

This application claims the benefit of U.S. Provisional Application No. 63/120,272 filed on Dec. 2, 2021, the entirety of which is incorporated by reference herein.

TECHNICAL FIELD

The invention relates to a memory circuit that is reconfigurable to replace defective memory cells with redundant memory cells.

BACKGROUND

Memory circuits are prone to faults that may occur during the fabrication process. For example, process variation may be one of the factors that cause defects in memory cells. A defective memory cell may be unable to hold its content, unstable with respect to memory operations, or cannot be accessed. Defective memory cells may be distributed randomly and along any direction on a chip. Memory defects adversely impact the total chip yield.

One solution for the defective memory problem is to add redundant memory cells to the memory. Typically, a memory test is conducted to identify faulty regions in the memory. The memory can be tested by external test hardware or by on-chip dedicated hardware. For example, a system-on-a-chip (SOC) platform may include a memory cell array coupled to a memory built-in self-test (MBIST) circuit. The MBIST circuit generates test patterns, identifies faulty memory regions from test results, and outputs repair signals to the memory. The memory is then reconfigured to replace defective memory cells with redundant memory cells within certain limits.

A random-access memory (RAM) with redundant memory cells and reconfiguration circuitry is called a repairable RAM. A higher degree of redundancy typically means more memory cells can be repaired. However, the redundancy not only increases the memory cell area, but also increases wires and pins that route the repair signals to the memory.

Therefore, there is a need for a memory repair mechanism that can provide a needed repair coverage with minimal overhead.

SUMMARY

In one embodiment, a memory circuit is provided to perform self-repair. The memory circuit includes a cell array, a controller, a row repair decoder, and a column repair decoder. The cell array includes multiple rows and multiple columns of memory cells. The controller receives an input indicating row repair or column repair, and a repair address shared by the row repair and the column repair of the cell array. The row repair decoder maps the repair address of a defective row to a redundant row of the cell array when the input indicates the row repair. The column repair decoder maps the repair address of a defective column to another column of the cell array when the input indicates the column repair.

In another embodiment, a system is provided to perform self-repair. The system includes a test circuit to generate test patterns and to identify defective memory cells. The system further includes a memory circuit coupled to the test circuit. The memory circuit includes a cell array, a controller, a row repair decoder, and a column repair decoder. The cell array includes multiple rows and multiple columns of memory cells. The controller receives an input indicating row repair or column repair, and a repair address shared by the row repair and the column repair of the cell array. The row repair decoder maps the repair address of a defective row to a redundant row of the cell array when the input indicates the row repair. The column repair decoder maps the repair address of a defective column to another column of the cell array when the input indicates the column repair.

In yet another embodiment, a method is provided for self-repairing a memory circuit. The method includes the step of receiving an input indicating row repair or column repair, and a repair address shared by the row repair and the column repair of a cell array. The cell array includes multiple rows and multiple columns of memory cells. The method further includes the steps of mapping the repair address of a defective row to a redundant row of the cell array when the input indicates the row repair; and mapping the repair address of a defective column to another column when the input indicates the column repair.

Advantages of the invention will be explained in detail in the following description.

BRIEF DESCRIPTION OF THE DRAWINGS

The invention is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described.

DETAILED DESCRIPTION

In the following description, numerous specific details are set forth. However, it is understood that embodiments of the invention may be practiced without these specific details. In other instances, well-known circuits, structures, and techniques have not been shown in detail in order not to obscure the understanding of this description. It will be appreciated, however, by one skilled in the art, that the invention may be practiced without such specific details. Those of ordinary skill in the art, with the included descriptions, will be able to implement appropriate functionality without undue experimentation.

Embodiments of the invention provide a memory circuit coupled to a shared fuse bus that carries repair information of a row or a column. The memory circuit can perform self-repair according to the repair information. The memory circuit may be any type of random-access memory (RAM); a non-limiting example is a static RAM (SRAM) circuit. In one embodiment, the memory circuit includes a cell array organized in multiple rows and multiple columns, including a redundant row and a redundant column. The fuse bus is shared between row repair and column repair; more specifically, the repair information carried on the fuse bus indicates either row repair or column repair. Memory repair is made by replacing a defective row or column with a working row or column as will be described in detail below.

In one embodiment, the memory circuit may be part of an SOC, and may be coupled to an on-chip test circuit (e.g., an MBIST circuit) via the fuse bus. The memory circuit may be coupled to the fuse bus through a set of fuse pins. The test circuit generates tests patterns and identifies defective memory cells. The test circuit then sends a fuse signal via the fuse bus to the memory circuit indicating the faulty memory region. The defective memory cells may extend along the row dimension or the column dimension of the memory cell array. The test circuit informs the memory circuit of row or column repair using the fuse bus. The memory circuit then self-repairs the defects in the identified row or column using the row or column redundancy.

According to embodiments of the invention, the memory circuit may switch between multiple types of repairs (e.g., row repair and column repair) depending on the fault pattern. This on-demand switch between row and column is more flexible than a one-dimensional (1-D) design where the reparability of either a row or a column is fixed in hardware. The flexibility in the repair types (e.g., row or column) improves the repair coverage of the memory and increases the overall chip yield.

Moreover, flexibility is achieved with negligible overhead because of the shared fuse bus and the shared fuse pins. Sharing a common set of fuse bus and fuse pins between rows and columns significantly reduces the wiring footprint (e.g., the number of pins and wires for routing the fuse signal) as compared with a two-dimensional (2-D) design. A 2-D design can repair both a row and a column at the same time, but requires much larger routing areas to accommodate two separate sets of fuse buses and pins for row repair and column repair.

In the following description, the terms "connect," "couple" and their derivatives, are used to indicate that two or more elements, which may or may not be in direct physical contact, have an electrical connection between or among them. Thus, the terms "connected" and "coupled" hereinafter are used equivalently to "electrically connected" and "electrically coupled," respectively.

Figure 1:
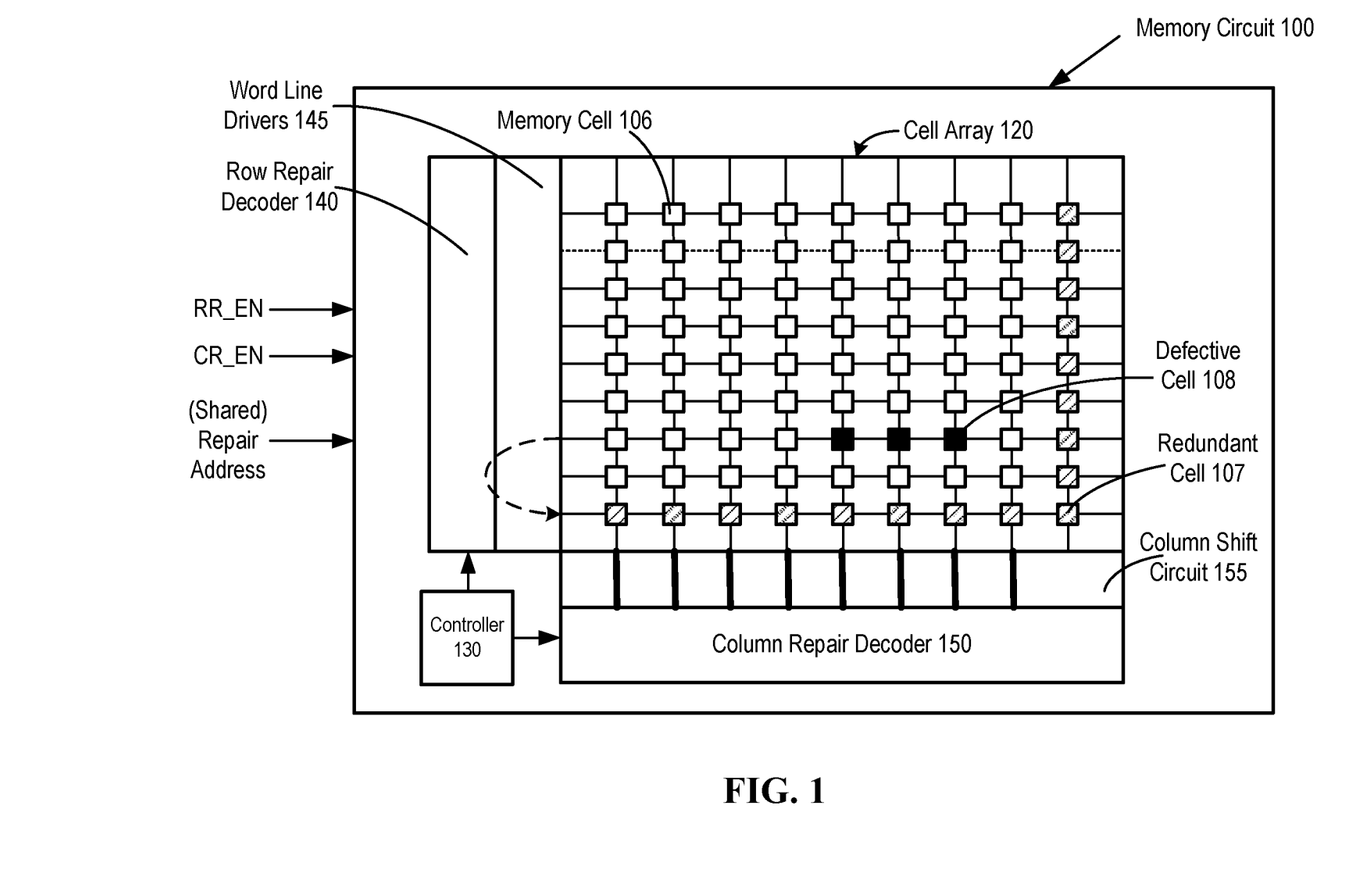
FIG. 1 illustrates a defect scenario that may occur in a memory circuit according to one embodiment.

FIG. 1 illustrates a defect scenario that may occur in a memory circuit 100 according to one embodiment. The memory circuit 100 includes a cell array 120, which further includes memory cells 106 arranged in multiple rows and multiple columns. The cell array 120 may include any number of multiple rows and any number of multiple columns. Each memory cell 106 is located at the intersection of a word line (represented by a horizontal line) and a data line (represented by a vertical line). The cell array 120 includes a redundant row and a redundant column. Memory cells in the redundant row and the redundant column are referred to as redundant cells 107. Each redundant cell 107 is represented in FIG. 1 by a square filled with a slanting-line pattern. In this disclosure, the memory cells 106 that are not in the redundant row and column are referred to as "regular cells." It is understood that a redundant cell has the same structure and function as a regular cell. Each column of regular cells is connected to a memory I/O port. Thus, access to the columns is also referred to as I/O access.

The cell array 120 may be tested for defects by the chip manufacturer. FIG. 1 shows one defect scenario where defective cells 108 lie in a row. Each defective cell 108 is represented in FIG. 1 by a darkened square. When the memory circuit 100 receives from a test circuit (not shown) a repair address indicating the row containing the defective cells 108, the memory circuit 100 performs self-repair by disabling the defective row and enabling the redundant row. A re-mapping of row addresses is configured to replace the defective row with the redundant row.

Figure 2:
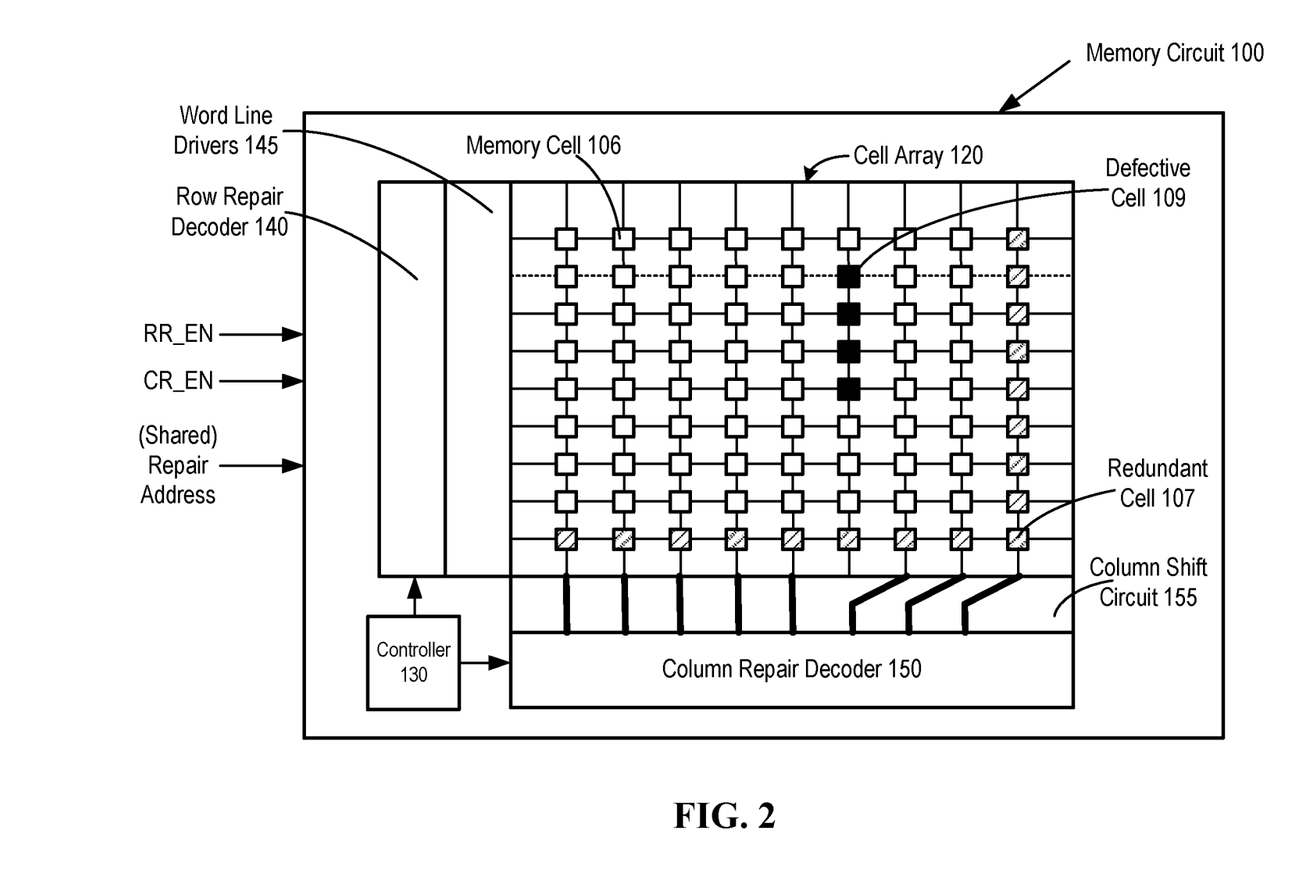
FIG. 2 illustrates another defect scenario that may occur in a memory circuit according to one embodiment.

FIG. 2 illustrates another defect scenario that may occur in the memory circuit 100 according to one embodiment. In this defect scenario, defective cells 109 lie in a column of the cell array 120. When the memory circuit 100 receives from a test circuit a repair address indicating the column containing the defective cells 109, the memory circuit 100 performs self-repair by disabling the defective column and enabling the redundant column. A re-mapping of column addresses is configured to replace the defective column with another column.

In one embodiment, the memory circuit includes a controller 130 to receive the repair address from the test circuit and to generate control signals accordingly to enable row repair or column repair, when memory self-repair is needed. The repair address is also referred to as a shared repair address, as it can be used to indicate either a row repair address or a column repair address.

In addition to the repair address, the memory circuit 100 also receives a row repair enable (RR_EN) signal and a column repair enable (CR_EN) signal from the test circuit. When only RR_EN is asserted, a row repair decoder 140 decodes the repair address to identify the defective row, and signals word line drivers 145 to replace the defective row with the redundant row. Each row of memory cells 106 is coupled to a word line driven by a corresponding word line driver 145. When one or more memory cells in a given row are found to be defective, the corresponding word line driver 145 is disabled, and the word line driver 145 coupled to the redundant row is enabled. Furthermore, access to the defective row is re-routed to the redundant row. FIG. 1 illustrates an example in which the $7^{th}$ row from the top is disabled and access to the $7^{th}$ row is re-routed or re-mapped to the redundant row.

In the example of FIG. 1, access to the columns (i.e., I/O access) remains unchanged. This is indicated by the straight lines in a column shift circuit 155, which may include a multiplexer for each column of regular cells (i.e., each column of memory cells not including the redundant column). According to the output of a column repair decoder 150, each multiplexer may be set to a default state (indicated by a straight line) or a "shifted state" (indicated by a bent line as shown in FIG. 2). A multiplexer in the default state connects a memory I/O port to a data line of regular cells in the same column. A multiplexer in the shifted state connects a memory I/O port to a data line in the next column. When all of the multiplexers are set to the default state, the redundant column is unused.

Referring to FIG. 2, when only CR_EN is asserted, the column repair decoder 150 decodes the repair address to identify the defective column, and signals the column shift circuit 155 to change the setting of its multiplexers starting from the defective column. FIG. 2 illustrates an example in which the $6^{th}$ column from the left (as shown in the example) is found to contain defective cells. The column shift circuit 155 sets the multiplexers of the $6^{th}$, $7^{th}$, and $8^{th}$ columns to the shifted state. That is, these multiplexers are configured to select their respective next columns, which are the $7^{th}$ column, the $8^{th}$ column, and the redundant column, respectively. The redundant column is selected to replace the last column of regular cells. Thus, the mapping between the memory I/O ports and the data lines is shifted by one column for those columns with column addresses (i.e., column indices) equal to or higher than that of the defective column. In this example, access to the rows remains unchanged.

Figure 3:
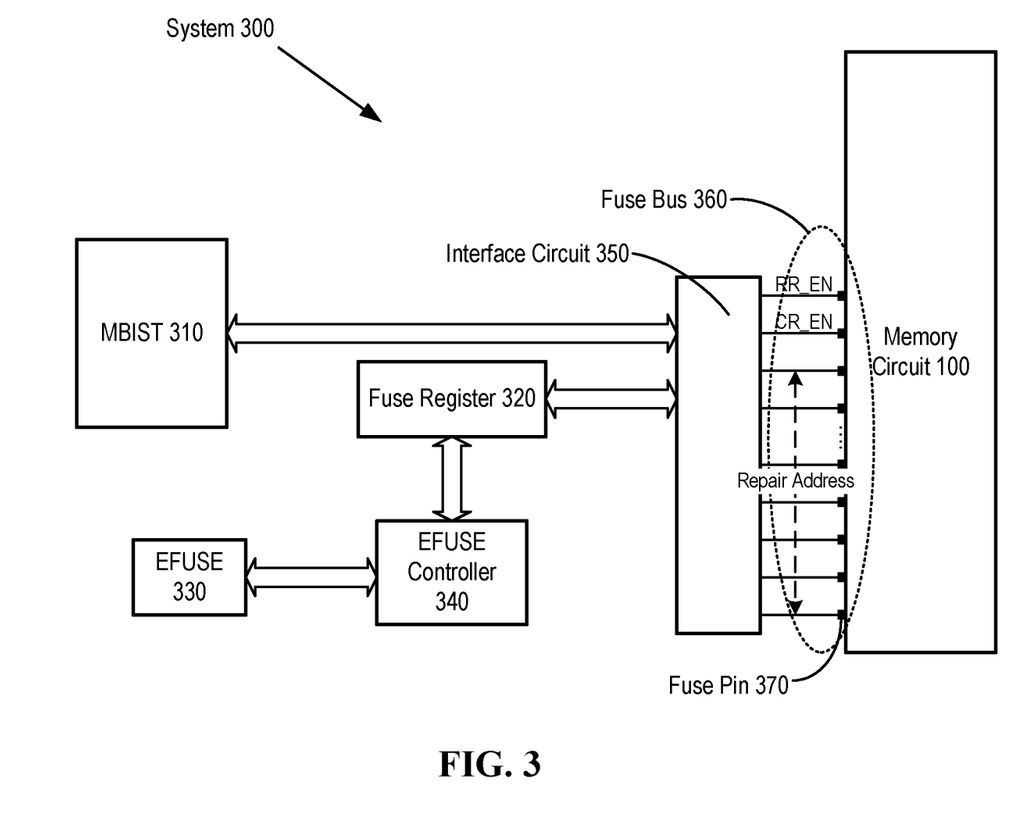
FIG. 3 illustrates a system including a memory circuit and a test circuit according to one embodiment.

FIG. 3 illustrates a system 300 including the memory circuit 100 (FIGS. 1 and 2) and a test circuit according to one embodiment. A non-limiting example of the test circuit is an MBIST circuit 310. In one embodiment, the system 300 may be part of an SOC. The MBIST circuit 310 sends test patterns to the memory circuit 100 via an interface circuit 350. From the output of the memory circuit 100, the MBIST circuit 310 determines a repair signature, such as the repair address of a row or a column. The repair signature is loaded into a fuse register 320 to test whether the memory circuit 100 is repairable. If it is confirmed that the memory circuit 100 can be repaired by the repair signature, the repair signature is burned into a fuse memory, such as an electronic fuse (EFUSE) 330. An EFUSE controller 340 controls the access to the EFUSE 330. On a chip reset, the EFUSE controller 340 reads out the content of the EFUSE 330, which is then loaded into the fuse register 320 and sent to the memory circuit 100.

The memory circuit 100 is coupled to a fuse bus 360 that includes wires (indicated by the wires in a dotted circle) to carry RR_EN, CR_EN, and a repair address. The wires of the fuse bus 360 connect to a set of fuse pins 370 of the memory circuit 100 (only one is labeled for simplicity). It is understood that the memory circuit 100 includes additional pins (not shown) for receiving signals from the MBIST circuit 310, the interface circuit 350, and other circuits. Compared with a 2-D design (where both a row and a column can be repaired at the same time), the shared repair address according to the disclosure reduces not only the wiring footprint of the fuse bus 360 coupled to the memory circuit 100, but also the routing areas taken by the wires represented by double-ended arrows in FIG. 3. Compared with a 1-D design (where the reparability of a row or a column is fixed in hardware), the fuse bus 360 provides flexibility with only one additional enable signal.

Figure 4:
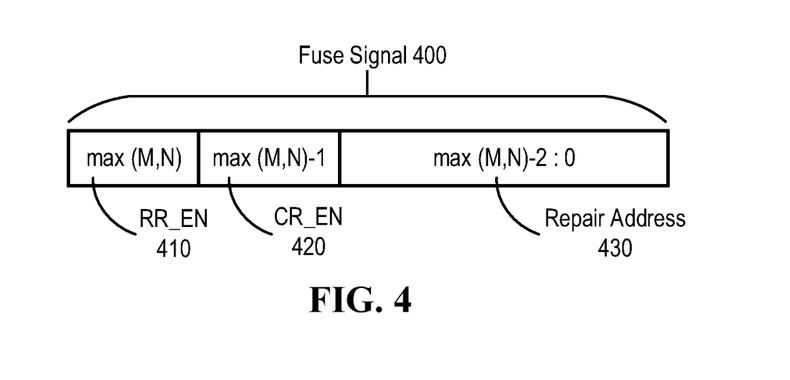
FIG. 4 illustrates an example of a fuse signal according to one embodiment.

FIG. 4 illustrates an example of a fuse signal 400 according to one embodiment. The fuse signal 400 is received by the memory circuit 100 through the fuse pins 370 of FIG. 3. For a cell array with M rows (including one redundant row) and N columns (including one redundant column), the fuse signal 400 includes a total of (max(M,N)+1) bits. For example, the fuse signal 400 may include a first bit indicating RR_EN 410, a second bit indicating CR_EN 420, and the remaining bits (max(M,N)−2:0) indicating a repair address 430 of either a row or a column. That is, the number of fuse pins used for the repair address 430 is equal to the greater of the row address width ((M−1) bits) and the column address width ((N−1) bits) for addressing a row and a column, respectively, in a cell array. Each bit of the fuse signal 400 is carried by a wire of the fuse bus 360 and received by the memory circuit 100 through a corresponding fuse pin 370. By using a shared repair address, the number of fuse pins 370 and fuse bus 360 wires can be significantly reduced when compared with having both repair addresses for rows and columns at the same time.

Figure 5:
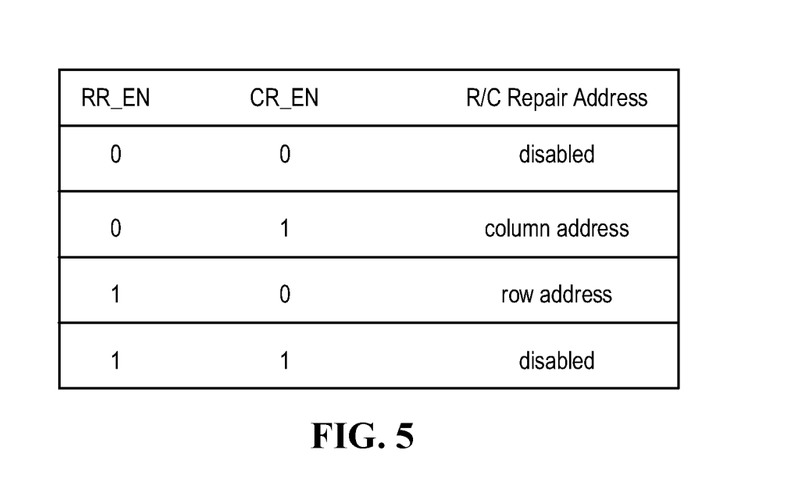
FIG. 5 illustrates logics for determining row repair or column repair according to one embodiment.

FIG. 5 illustrates logics for determining row repair or column repair according to one embodiment. When both CR_EN and RR_EN are de-asserted (e.g., logic low as represented by 0), both the row repair and the column repair are disabled. That is, no self-repair is performed. Similarly, when both CR_EN and RR_EN are asserted (e.g., logic high as represented by 1), both the row repair and the column repair are disabled. That is, no self-repair is performed. When RR_EN is de-asserted and CR_EN is asserted, row repair is disabled and column repair is enabled. That is, the repair address indicates a defective column address. When RR_EN is asserted and CR_EN is de-asserted, row repair is enabled and column repair is disabled. That is, the repair address indicates a defective row address.

Figure 6:
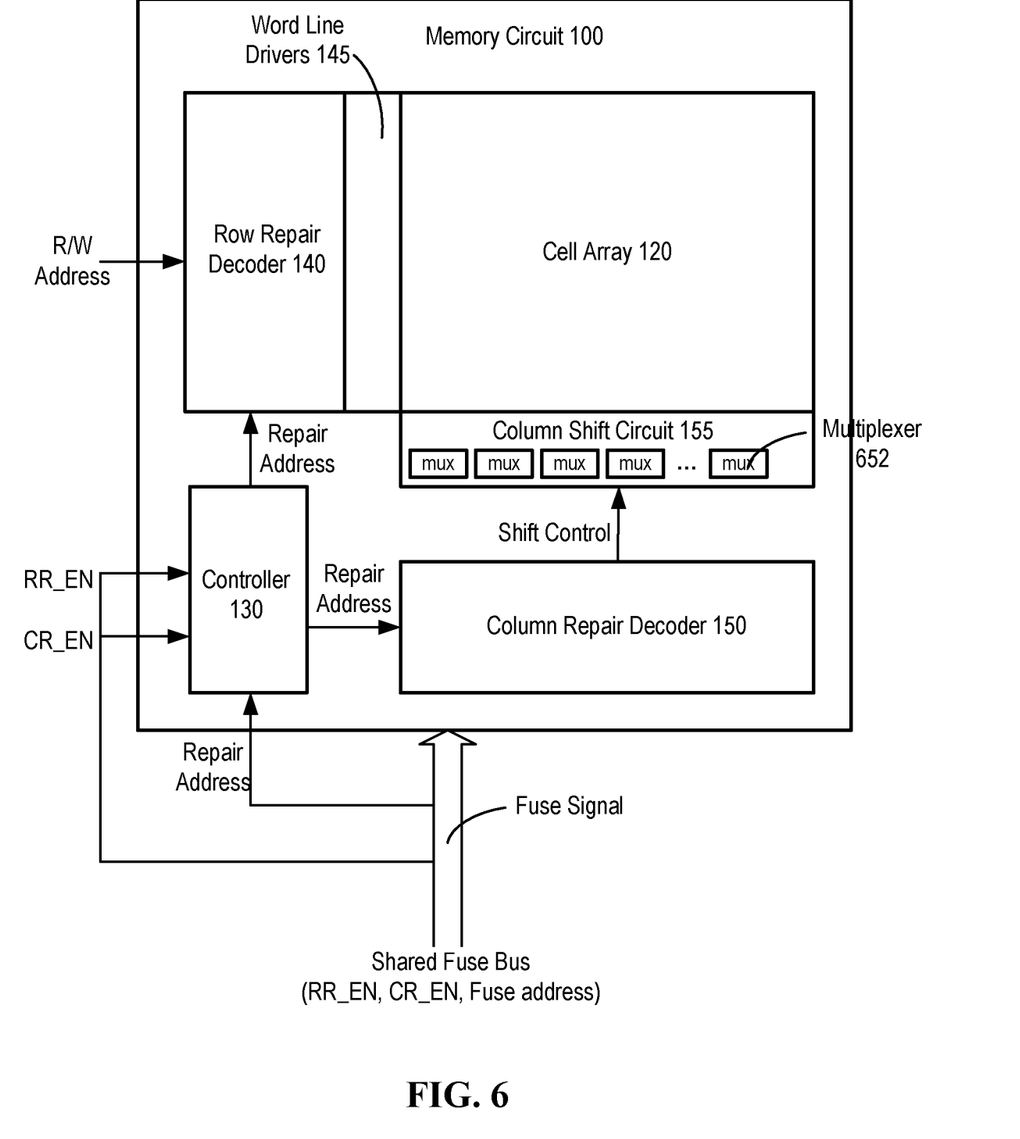
FIG. 6 illustrates a memory circuit that performs self-repair according to one embodiment.

FIG. 6 illustrates further details of the memory circuit 100 according to one embodiment. Components that are the same as those in FIGS. 1 and 2 are labeled with the same numerals. In one embodiment, the controller 130 in the memory circuit 100 receives the fuse signal 400 (FIG. 4). The controller 130 may apply the logic shown in FIG. 5 to the fuse signal 400 to determine whether a row repair or a column repair is to be performed. The controller 130 then passes the repair address to either the row repair decoder 140 or the column repair decoder 150 according to the determination. The controller 630 does not forward the fuse signal 400 when both RR_EN and CR_EN are asserted or de-asserted. Alternatively, both the row repair decoder 140 and the column repair decoder 150 may receive the fuse signal 400 and apply the logic shown in FIG. 5 to determine whether a row repair or a column repair is to be performed.

In one embodiment, when the row repair decoder 140 receives a repair address for row repair, the row repair decoder 140 configures a mapping of the repair address to the redundant row. The repair address in this case is the defective row address. When the memory circuit 100 receives the defective row address for read or write operations, the row repair decoder 140 maps the defective row address to the redundant row.

In one embodiment, when the column repair decoder 150 receives a repair address for column repair, the column repair decoder 150 generates a shift control signal to set each multiplexer 652 in the column shift circuit 155 to either the default state or the shifted state as described before in connection with FIGS. 1 and 2. The repair address in this case is the defective column address.

Figure 7:
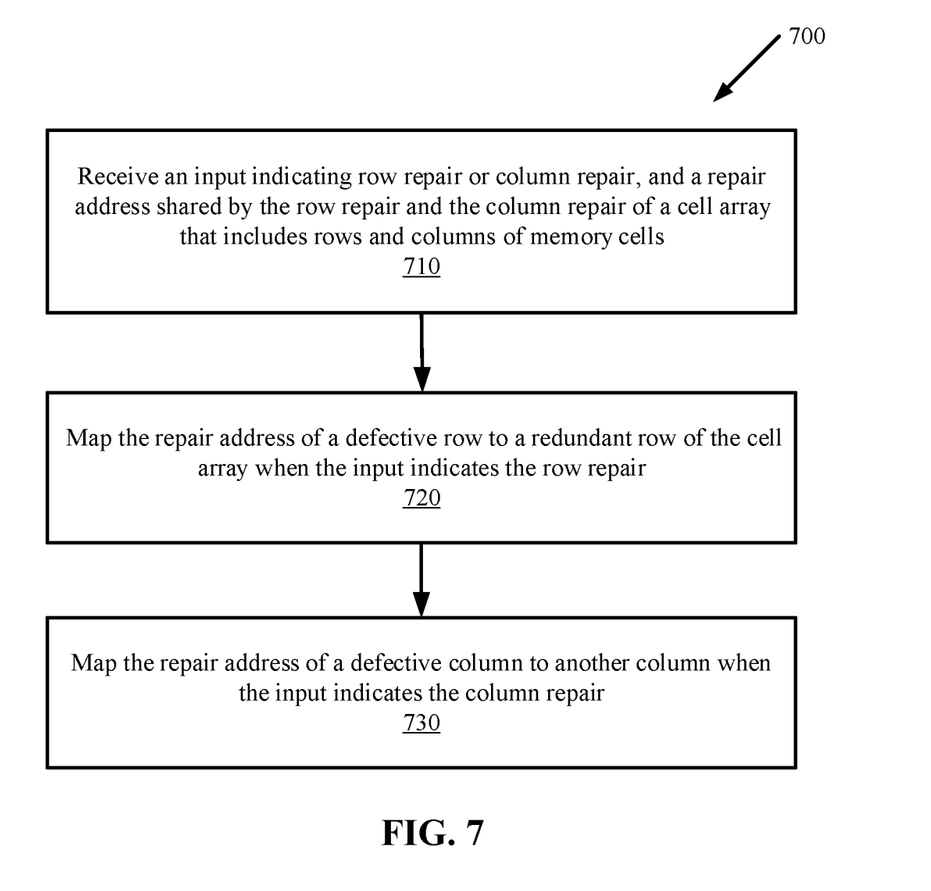
FIG. 7 is a flow diagram illustrating a method for self-repair of a memory circuit according to one embodiment.

FIG. 7 is a flow diagram illustrating a method 700 for self-repair of a memory circuit according to one embodiment. Method 700 may be performed by a memory circuit, such as the memory circuit 100 in FIGS. 1, 2, and 6. The memory circuit has fuse pins and a fuse bus shared by row repair and column repair.

At step 710, the memory circuit receives an input indicating row repair or column repair, and a repair address shared by the row repair and the column repair of a cell array. The cell array includes multiple rows and multiple columns of memory cells. At step 720, the memory circuit maps the repair address of a defective row to a redundant row when the input indicates the row repair. At step 730, the memory circuit maps the repair address of a defective column to another column when the input indicates the column repair.

The operations of the flow diagram of FIG. 7 have been described with reference to the exemplary embodiments of FIGS. 1, 2, and 6. However, it should be understood that the operations of the flow diagram of FIG. 7 can be performed by embodiments of the invention other than those discussed with reference to FIGS. 1, 2, and 6, and the embodiments discussed with reference to FIGS. 1, 2 and 6 can perform operations different than those discussed with reference to the flow diagram. While the flow diagram of FIG. 7 shows a particular order of operations performed by certain embodiments of the invention, it should be understood that such order is exemplary (e.g., alternative embodiments may perform the operations in a different order, combine certain operations, overlap certain operations, etc.).

While the invention has been described in terms of several embodiments, those skilled in the art will recognize that the invention is not limited to the embodiments described, and can be practiced with modification and alteration within the spirit and scope of the appended claims. The description is thus to be regarded as illustrative instead of limiting.

What is claimed is:

1. A memory circuit operative to perform self-repair, comprising:
   a cell array including a plurality of rows and a plurality of columns of memory cells;
   a controller to receive an input of a fuse signal that indicates a repair address shared by row repair and column repair of the cell array, the fuse signal including an enable signal that indicates whether the repair address is for the row repair or the column repair;
   a row repair decoder to receive the repair address of a defective row from the controller when the enable signal indicates the row repair, and to map the repair address to a redundant row of the cell array; and
   a column repair decoder to receive the repair address of a defective column from the controller when the enable signal indicates the column repair, and to map the repair address to another column of the cell array,
   wherein the memory circuit is part of a chip and is to receive the fuse signal from a fuse memory through a plurality of fuse pins of the chip.

2. The memory circuit of claim 1, wherein the enable signal includes one bit indicating row repair enable (RR_EN), another bit indicating column repair enable (CR_EN), and a set of bits indicating the repair address of either a row or a column.

3. The memory circuit of claim 2, wherein and the self-repair is performed when only one of the RR_EN and the CR_EN is asserted.

4. The memory circuit of claim 1,
   wherein the repair address has a width that is equal to the greater of a row address width and a column address width.

5. The memory circuit of claim 1, wherein the row repair decoder is operative to replace the defective row with the redundant row, and the column repair decoder is operative to shift the defective column and subsequent columns by one column.

6. The memory circuit of claim 1, wherein the cell array includes one redundant row and one redundant column of memory cells.

7. The memory circuit of claim 1, wherein the cell array is a static random access memory (SRAM) cell array.

8. A system operative to perform self-repair, comprising:
   a test circuit to generate test patterns and to identify defective memory cells;
   a fuse memory coupled to the test circuit to store a repair address shared by row repair and column repair of a cell array; and
   a memory circuit in a chip that is coupled to the test circuit and the fuse memory, the memory circuit further comprising:
      the cell array including a plurality of rows and a plurality of columns of memory cells;
      a controller to receive an input of a fuse signal that indicates the repair address, the fuse signal including an enable signal that indicates whether the repair address is for the row repair or the column repair;
      a row repair decoder to receive the repair address of a defective row from the controller when the enable signal indicates the row repair, and to map the defective row to a redundant row of the cell array; and
      a column repair decoder to receive the repair address of a defective column from the controller when the enable signal indicates the column repair, and to map the repair address to another column of the cell array,
   wherein the memory circuit is to receive the fuse signal from the fuse memory through a plurality of fuse pins of the chip.

9. The system of claim 8, wherein the enable signal includes one bit indicating row repair enable (RR_EN), another bit indicating column repair enable (CR_EN), and a set of bits indicating the repair address of either a row or a column.

10. The system of claim 9, wherein the self-repair is performed when only one of the RR_EN and the CR_EN is asserted.

11. The system of claim 8, further comprising:
    a fuse bus to carry the fuse signal to the memory circuit, wherein the fuse bus carries one bitone bit indicating row repair enable (RR_EN), another bit indicating column repair enable (CR_EN), and a set of bits indicating the repair address of either a row or a column.

12. The system of claim 8,
    wherein the repair address has a width that is equal to the greater of a row address width and a column address width.

13. The system of claim 8, wherein the test circuit is a memory built-in self-test (MBIST) circuit.

14. The system of claim 8, wherein the cell array is a static random access memory (SRAM) cell array.

15. A method for self-repair of a memory circuit, comprising:
    receiving, by a controller of the memory circuit, an input of a fuse signal that indicates a repair address shared by row repair and column repair of a cell array, the fuse signal including an enable signal that indicates whether the repair address is for theindicating row repair or the column repair, wherein the cell array that-includes a plurality of rows and a plurality of columns of memory cells;
    mapping, by a row repair decoder of the memory circuit, the repair address of a defective row to a redundant row of the cell array, wherein the repair address is received by the row repair decoder from the controller when the enable signal indicates the row repair; and
    mapping, by a column repair decoder of the memory circuit, the repair address of a defective column to another column, wherein the repair address is received by the column repair decoder from the controller when the enable signal indicates the column repair,
    wherein the memory circuit is part of a chip and is to receive the fuse signal from a fuse memory through a plurality of fuse pins of the chip.

16. The method of claim 15, wherein the enable signal includes one bit indicating row repair enable (RR_EN), another bit indicating column repair enable (CR_EN), and a set of bits indicating the repair address of either a row or a column.

17. The method of claim 16, wherein the self-repair is performed when only one of the RR_EN and the CR_EN is asserted.

18. The method of claim 15, wherein the cell array includes one redundant row and one redundant column of memory cells.

19. The method of claim 15, wherein the cell array is a static random access memory (SRAM) cell array.

* * * * *